United States Patent

[11] 3,609,349

[72] Inventor Emil F. Brinker
Churchill Borough, Pa.

[21] Appl. No. 887,551
[22] Filed Dec. 23, 1969
[45] Patented Sept. 28, 1971
[73] Assignee Westinghouse Air Brake Company
Swissvale, Pa.

[54] PRECISION PRESENCE DETECTOR
15 Claims, 2 Drawing Figs.

[52] U.S. Cl. .......... 246/124, 246/63 A, 340/282
[51] Int. Cl. .......... B61l 25/02
[50] Field of Search .......... 246/29 R, 63 A, 30, 124, 249; 340/382, 258, 282

[56] References Cited

UNITED STATES PATENTS 2,790,071 4/1957 Gunn .......... 246/124

*Primary Examiner*—Arthur L. La Point
*Assistant Examiner*—George H. Libman
*Attorneys*—H. A. Williamson, A. G. Williamson, Jr. and J. B. Sotak

ABSTRACT: This disclosure relates to a precision presence detector having an oscillating amplifying means which is normally in a nonoscillating condition. The oscillating means includes a first and a second inductive sensing element which are positioned in a predetermined relationship with each other so that essentially zero magnetic coupling normally exists between the two sensing elements. The presence detector also employs an inert type of tuning means which is normally tuned to a given frequency. The tuning means includes a first and a second tuned inductive element which are spaced in the same predetermined relationship as the inductive sensing elements. Thus, the oscillating amplifying means will begin oscillating whenever the first and second tuned inductive elements of the tuning means are substantially directly aligned with and in proximity to the first and second inductive sensing elements.

Figure 1:
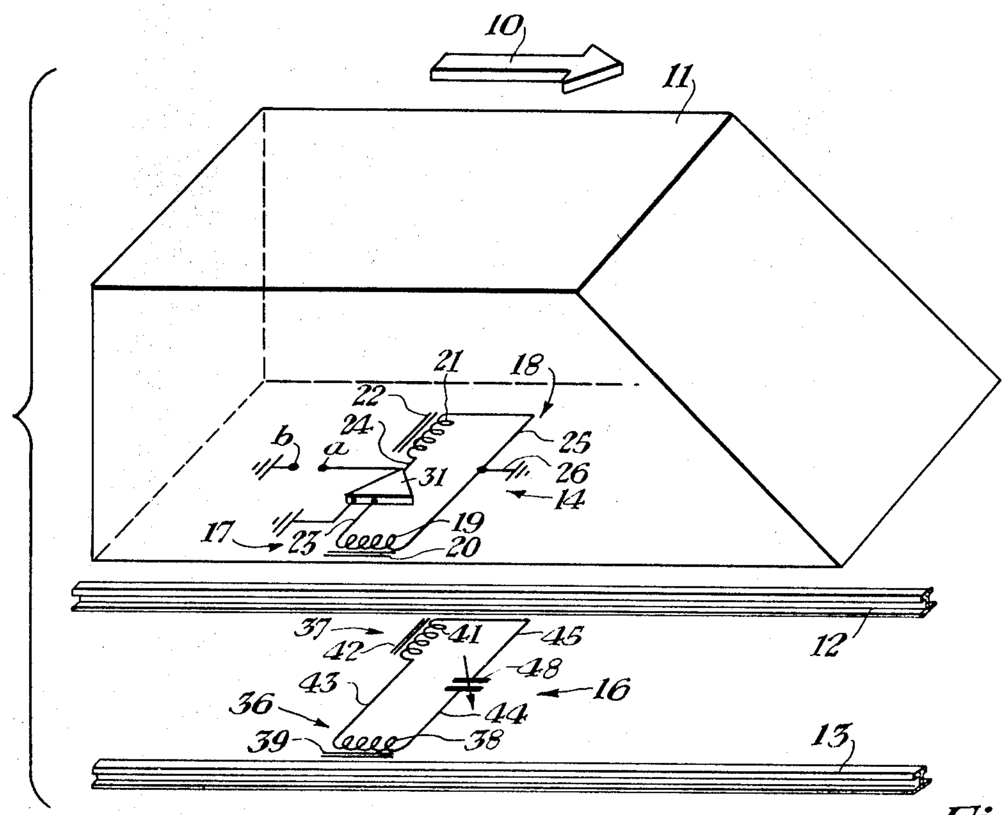

INVENTOR
Emil F. Brinker

John B. Sotak

PRECISION PRESENCE DETECTOR

My invention relates to precision presence detectors.

More specifically, my invention relates to precision presence detectors comprising in combination a broadband oscillating means having first and second inductive sensing elements and an inert type of tuning means having first and second tuned inductive elements. The first and second inductive sensing elements are spaced in a predetermined relationship with each other so that, in the absence of the tuning means, there exists essentially zero magnetic coupling between the first and second inductive sensing elements, and, therefore, the oscillating means normally assumes a nonoscillating or quiescent condition. The first and second tuned inductive elements are also spaced in the same predetermined relationship with each other as the first and second tuned inductive sensing elements. The tuning means is arranged to resonate at a preselected frequency and provide the necessary feedback coupling for the oscillating means. Accordingly, whenever the first and second tuned inductive elements are in direct respective alignment with and proximate to the first and second inductive sensing elements, the oscillating means will begin oscillating at the same preselected tuned frequency of the tuning means. That is, the necessary inductive coupling for the broadband oscillating means only exists when the first tuned and sensing elements and the second tuned and sensing elements are in proper relationship with each other. Hence, oscillation of the oscillating means at the preselected frequency provides an indication of the presence of the tuning means and precisely indicates that the oscillating means and the tuning means are in substantially direct alignment with and proximate to each other.

It is desirable in railroad operations to provide or receive a signal when a railway vehicle passes a given point along its path of travel. Previously, this was accomplished by employing a single inert wayside coil tuned to a preselected frequency and a pair of a closely spaced or partially overlapping vehicle carried coils. The vehicle coils were commonly connected in the feedback loop of an amplifier circuit and were arranged such that there was normally zero magnetic coupling existing between them. Thus, the amplifier was normally dormant and a nonoscillating condition existed. Now when the vehicle-carried coils were in the vicinity or passed over the wayside coil, the amplifier would begin to oscillate at the preselected tuned frequency thereby indicating the presence of a railway vehicle. However, it has been found that the vehicle bodies adversely affect the operation of the vehicle-carried apparatus. In order to reduce the effect of extrinsic magnetic fields due to the metallic body of the vehicle, it was generally necessary to employ a large magnetic coil as well as to position the vehicle-carried coils very closely to one another. Even this approach did not prove entirely satisfactory in that the presence of stray magnetic flux fields within the metallic vehicle body as well as other stray fields caused erroneous indications to be produced by vehicle-carried apparatus. Thus, prior art presence detectors were not only unreliable due to their erratic operation but also relatively expensive due to their massive structure. Also these previous detectors were quite sensitive and therefore difficult to initially adjust as well as to subsequently maintain the required null condition between the vehicle-carried coils.

To alleviate the above-noted problems, a precision presence detector to be described herein operates with two normally nonoscillating coils spaced in a predetermined relationship with each other. The creation of a distinct large gap or space between the two nonoscillating coils and their orientation in space relative to each other and to the metallic body of the vehicle negates the effects or extrinsic magnetic fields of the metallic vehicle body of the vehicle as well as of spurious fields present in the milieu. Further, it has been found that by reducing the size of the coils, the initial null adjustment is less critical or unnecessary, and thus subsequent maintenance problems are avoided. In addition, the reduction in coil size results in a savings of material and labor by employing two tuned coils which are spaced the same distance apart as the two nonoscillating coils. A more accurate indication can be achieved since an oscillating condition will only occur when both the nonoscillating coils and the tuned coils are directly in line with and proximate to each other.

It is therefore an object of this invention to provide a novel precision presence detector that is insensitive to extrinsic magnetic fields.

Another object of this invention is to provide an improved presence detector that results in precise detection and indication of a vehicle passing a given point along its path of travel.

Yet another object of this invention is to provide a new and improved precision presence detector having a pair of feedback coils and pair of inductive elements which are compact in size and economical in cost.

Still another object of this invention is to provide a novel precision presence detector which is relatively easily adjusted and maintained.

Yet still another object of this invention is to provide an improved precision presence detector which employs a broadband type of active oscillating means having a plurality of nonoscillating coils and an inert type of passive tuning means having a plurality of tuned coils positioned such that the precise alignment of the tuned coils relative to the nonoscillating coils results in oscillations to be produced by the oscillating means thereby indicating the exact presence of the tuning means.

In the attainment of the foregoing objects, the precision presence detector is arranged to provide an indication of the presence of a railway vehicle at a specific point along its predetermined path of travel. The precision detector comprises, in combination, an amplifier means having first and second inductive sensing elements and a resonant circuit means having first and second tuned inductive elements interconnected by a tuning capacitor. Each of the sensing and inductive elements comprises a pair of electrical coils wound on ferrite cores. In one embodiment the amplifier means is mounted on a railway vehicle which moves along a predetermined path of travel while the resonant circuit means is positioned at a preselected point along the predetermined path. In a second embodiment, the amplifier means is situated at a given point along the wayside and the resonant circuit means is carried by the railway vehicle. In each embodiment the first and second inductive sensing elements are spaced in a predetermined relationship with each other so that essentially zero magnetic coupling exists between them in the absence of the resonant circuit means and thus the amplifier means is initially in a nonoscillating or quiescent condition. The first and second tuned inductive elements are also spaced in the same predetermined relationship with each other as the first and second inductive sensing elements. Accordingly, whenever the first and second inductive elements are in direct respective alignment with and proximate to the first and second inductive sensing elements, the amplifier means will oscillate at the preselected frequency of the resonant circuit. Hence, the oscillation of the amplifier means provides an exact indication that the railway vehicle is presently at the preselected point along its predetermined path of travel.

Other objects and advantages of the present invention will become apparent from the ensuing description of illustrative embodiments thereof, in the course of which reference is had to the accompanying drawings in which:

FIG. 1 illustrates a first embodiment of the precision presence detector of the present invention in which the above-mentioned amplifier means includes a pair of inductive sensing elements positioned on and traveling the width of a moving railway vehicle while the above-mentioned resonant circuit means includes a pair of the tuned inductive elements and a tuning capacitor. The pair of tuned inductive elements are positioned along the wayside and are spaced exactly dimensionally apart from each other as the pair of inductive sensing elements.

Figure 2:
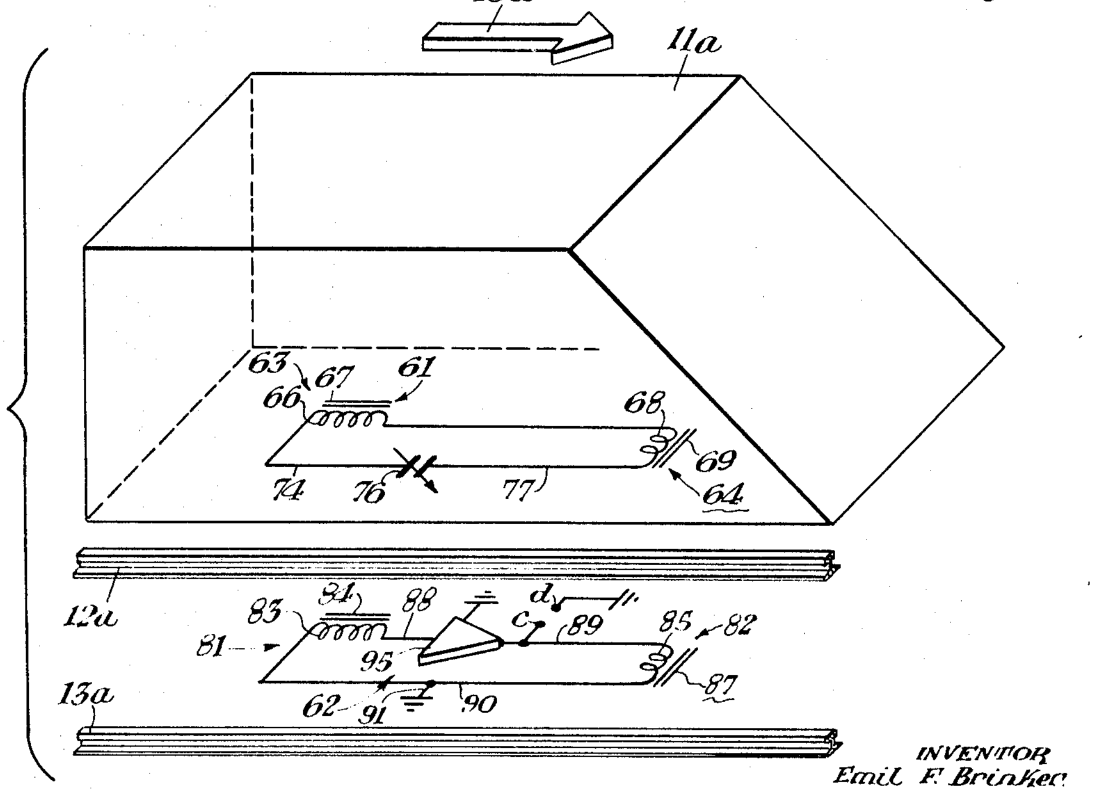

FIG. 2 illustrates a second embodiment of the precision presence detector of the present invention in which the above-mentioned resonant circuit means includes a pair of inductive tuned elements positioned longitudinally along a moving railway vehicle while the above-mentioned amplifier means includes a pair of inductive sensing elements positioned on the wayside and spaced exactly dimensionally apart from each other as are the inductive tuned elements. A description of the above embodiments will follow and then the novel features of the invention will be set forth in the appended claims.

Referring now to the drawing, and more particularly to FIG. 1, there is shown a first embodiment of the precision presence detector of the present invention. Schematically depicted in FIG. 1 is a railway vehicle 11 shown somewhat elevated above a pair of running rails 12 and 13 and normally moving in a direction as shown by the arrow 10. Positioned traversing the width and at preferably but not necessarily the bottom of vehicle 11 is an oscillating means 14 which forms, for example, a receiver or the like for indicating the distance to travel to a station stop for signaling the operator or some other purpose. The oscillating means 14 includes a first input inductive sensing element 17, a broadband amplifier means 31 and a second output inductive sensing element 18. Each of the first and second inductive sensing elements 17 and 18 comprises a winding or coil 19 and 21 wound about a ferrite core 20 and 2, respectively. The amplifier 31 which may be either a tube or transistor type includes suitable supply and operating potentials (not shown). The first inductive sensing element 17 is electrically coupled to an input of the amplifier means 31 via the lead 23. As shown, the other input lead of the amplifier means 31 is suitable grounded. The second inductive sensing element 18 is electrically coupled to an output side of the amplifier means 31 via the lead 24. Both the first and second inductive sensing elements 17 and 18 are also electrically interconnected to each other via common lead 25 which, inturn, is grounded via lead 26. The presence of an AC ground via lead 26 prevents regeneration and unwanted oscillation from occurring due to current flowing from the output of the amplifier to its input. As shown, a pair of output terminals *a* and *b* are connected to amplifier 31 for providing a signal indication at the appropriate time. The terminal *a* is directly connected to the output of the amplifier means 31 while the terminal *b* is directly connected to ground.

As shown, the inductive sensing elements 17 and 18 are initially positioned and spaced apart a sufficient amount from each other so that essentially zero magnetic coupling exists between them even in the presence of the metallic body presented by the vehicle 11. It has been found that by orienting the inductors 17 and 18 90° in relation to each other that minimum coupling is attained and that after initial positioning at the factory, no field adjustments are required thereafter, even though environmental conditions may vary from place to place along the wayside. However, it will be understood that the inductors 17 and 18 may be positioned in parallel alignment with each other, but some adjustment may be necessary to obtain minimum coupling. Further, it will be appreciated that a zero or null magnetic condition is more easily attained when the distance between the inductors 17 and 18 is increased in that the metallic vehicle becomes less critical upon the elements due to ever increasing losses. Thus, the amplifier 31 is initially adjusted to a quiescent condition and the oscillating means 14 will normally assume a nonoscillating condition.

In reviewing FIG. 1, it will be noted that there is shown positioned widthwise and stationary between the rails 12 and 13 a wayside resonant circuit means 16 which may be located a preselected distance from, for example, a station platform. The resonant circuit means 16 includes a first inductive tuned element 36, a second inductive tuned element 37 and a variable capacitive tuning device 48. Each of the first and second inductive tuned elements 36 and 37 comprises a winding or coil 38 and 41 wound about a ferrite core 39 and 42, respectively. One end of the first inductive tuned element 36 is directly coupled to one end of the second inductive tuned element 37 via lead 43, while their other ends are directly coupled to the respective sides of the tuning capacitor 48 via leads 44 and 45. Accordingly, with the variable capacitor 48 adjusted to a predetermined value, the resonant circuit 16 is adapted to a resonate at a predetermined frequency. In the series arrangement shown, it is obvious that the resonant frequency is determined by the LC time constant of the capacitor 48 and the inductive tuned elements 36 and 37. As shown, the inductive tuned elements 36 and 37 are also disposed 90° relative to each other and are arranged in the same relationship as the vehicle-carried inductive sensing elements 17 and 18.

In operation, the oscillating means 14 which is carried by the vehicle 11 is generally dormant until the vehicle 11 which normally moves in a direction shown by arrow 10 passes over the stationary resonant circuit means 16. NOw, assume, for example, that the approaching vehicle 11 is directly over the wayside point at which the tuning means 16 is disposed. Under this condition, tuned elements sensing elements 17 and 18 and the inductive tuned elements 36 and 37 will be in direct alignment with and proximate to each other. That is, at this point the longitudinally disposed sensing element 17 will be directly above the longitudinally disposed inductive tuned element 36 while the traversely disposed inductive sensing element 18 will be directly above the transversely disposed inductive tuned element 37. When this exact alignment occurs, the magnetic coupling between the inductive tuned element 36 and inductive sensing element 17 and the magnetic coupling between the inductive tuned element 37 and inductive sensing element 18 will cause a tuned feedback loop to be closed around amplifier 31 so that oscillation will occur. Thus, the oscillating means 14 will produce oscillations at the frequency as determined by the LC time constants of the tuning means 16. Accordingly, oscillating signals appearing across terminals *a* and *b* of the amplifier means 31 will provide a precise indication that the inductive sensing elements 17 and 18 are in direct alignment with and proximate to the inductive tuned elements 36 and 37. Thus, a trainman can more accurately establish that the vehicle 11 is at a given position along its route of travel. For example, in station stopping operations, the placement and frequency of resonant circuit 16 may be employed to give an exact indication of the distance to go to stopping.

Referring now to FIG. 2, there is illustrated a second embodiment of the present invention in which a vehicle **11*a* approaching given wayside point may precisely signal a remote station of its given position along its route of travel. In this embodiment, the resonant circuit means generally depicted by reference numeral 61 is carried by vehicle 11*a*, As in FIG. 1, the resonant circuit means 61 includes a pair of inductive tuned elements 63 and 64 which are now positioned longitudinally relative to the length of railway vehicle 11*a*, As shown, disposed between the rails 12*a* and 13*a* is the oscillating means which is generally depicted by reference numeral 62. It will be noted that the oscillating means 62, as in FIG. 1, includes a pair of inductive sensing elements 81 and 82. However, in this embodiment, the inductive sensing elements are fixedly positioned longitudinally between the rails 12*a* and 13*a*, In addition to the first and second inductive tuned elements 63 and 64, the resonant circuit means 62 includes a variable tuning capacitive device 76 similar to that described in FIG. 1. Each of the first and second tuned elements 63 and 64 comprises an electrical winding or coil 66 and 68 wound about a magnetic or ferrite core 67 and 69, respectively. One end of the inductive winding 66 is directly coupled to one end of the inductive winding 68, while their other ends are serially connected by tuning capacitor 76. By suitable adjusting the capacitive value of capacitor 76, the resonant frequency of the vehicle-carried means 61 may be varied. In any case, it will be understood that the preselected resonant frequency is determined by the LC time constants of the series capacitor 76 and inductive elements 63 and 64**.

As shown, the inductive tuned elements 63 and 64 are spaced apart a predetermined amount relative to each other and are again oriented 90° with respect to each other. It will be noted that the inductor 63 is positioned longitudinally relative to the track while the inductor 64 is positioned tranversely relative to the track.

In viewing FIG. 2, it will be seen that the oscillating means 62 includes first and second inductive sensing elements 81 and 82 which are positioned along the rails 12*a* and 13*a*, Each of the first and second inductive sensing elements 81 and 82 comprises a wire wound winding or coil 83 and 85 each of which is suitable wrapped around separate ferrite cores 84 and 87 respectively. As shown, one side of the coil 83 is electrically coupled to one terminal of the input of a tube or transistor amplifier means 95 via the lead 88 while the other input terminal of amplifier 95 is connected directly to ground. The coil 85 is shown electrically coupled to the output side of the amplifier 95 via the lead 89. Both of the coils 83 and 85 are electrically interconnected by a common lead 90 which is grounded via lead 91. A pair of output terminals *c* and *d* are connected to the amplifying means 95 and may be adapted to feed a suitable indicating device for denoting the presence or passage of vehicle 111*a* along its path of travel as will be described presently.

As shown, the inductive sensing elements 81 and 82 are spaced apart in substantially the same predetermined relationship as the inductive tuned elements 63 and 64. Like in FIG. 1, the 90 relative orientation of the inductors assists and minimizes the effects of mutual coupling between the coils and substantially eliminates faulty adjustments.

Now, when the resonant circuit means 61, which is carried by the vehicle 11*a*, moves over the oscillating means 62 which is disposed between rails 12*a* and 13*a*, sufficient inductive coupling will exist between each of the two aligned pairs of inductors. It will be noted that inductive tuned elements 63 and 64 are spaced apart the same distance as the inductive sensing elements 81 and 82 and also are angularly oriented in the same direction as inductors 81 and 82. Accordingly, whenever the inductive tuned element 63 is directly aligned with and proximate to the inductive sensing element 81 and simultaneously the inductive tuned element 64 is directly aligned with and proximate to inductive sensing element 82, a transformer action takes place between the pairs of inductors. That is, magnetic coupling between the inductive tuned element 67 and inductive sensing element 84 and the inductive tuned element 64 and inductive sensing element 82 will complete a feedback path for amplifier 95 through the resonant circuit means 61. Thus, the oscillating means 62 will be tightly coupled to and will produce oscillations at a frequency determined by the resonant circuit means 61. The oscillating signals produced by amplifier 95 may be taken from across output terminals *c* and *d* to provide a wayside signal of the vehicle passing. For example, in an automatic railway communication information system, the wayside signal may be employed to operate an annunciator. Thus, it will appreciated that the use of a broadband amplifier in association with the variable resonant circuit provides great latitude in frequency selection so that discrete frequencies may be employed to signify different vehicles or trains.

While the embodiments described herein refer to specific orientations of the oscillating means and the resonant circuit means, it will be noted that numerous orientations and displacement schemes are readily obtainable which are in keeping with the concepts of the present invention. Further, it will also be understood that the type, size and other characteristics of each of the magnetic cores may be varied in each of the above-described inductive tuned and sensing elements. While in each embodiment the output oscillating signals are taken directly across a pair of output terminals, it will be understood that these signals may be derived from across the sensing inductors. Likewise, suitable signals may be derived from across the inductors or capacitors of the resonant circuit means. In actual practice, the ends of the sensing inductors may be individually connected to ground thereby obviating the need for a common ground which prevents the possibility of unwanted oscillations from occurring. Still further, it will be noted that while the instant invention has been described with reference to a railroad environment, my presence detector may be employed in any operation in which it is desired to precisely detect an object moving relative to some reference point.

Also, it will be noted that with the shown arrangements no oscillation will take place when the vehicle faces the opposite direction since the vehicle-carried coils and the wayside coils are mismatched. However, if one employs two circuits on the wayside which are mirror images of each other such an arrangement may be used to indicate the orientation and direction of movement of the vehicle or train which can be useful information.

Thus, it is apparent that the new and improved precision presence detector of the present invention provides an extremely accurate object presence indication which is compact in size, inexpensive in cost, and negligibly susceptible to external magnetic effects.

Although I have herein shown and described several forms of a precision presence detector embodying my invention, it is to be understood that changes and modifications within the scope of the appended claims may be made without departing from the spirit and scope of the present invention.

Having thus described my invention, what I claim is:

1. A precision presence detector comprising in combination:

a. an oscillating means having first and second inductive sensing elements, b. an inert tuning means having first and second inductive tuned elements, said first and second inductive sensing elements spaced in a predetermined relationship with each other so that essentially a zero magnetic coupling exists between said first and said second inductive sensing elements, and said oscillating means normally assumes a nonoscillating condition, said first and second inductive tuned elements spaced in the same said predetermined relationship with each other as said first and second inductive sensing elements, said inert tuning means resonating at a preselected frequency so that whenever said first and second inductive tuned elements are in direct alignment with and proximate to said first and second inductive sensing elements, respectively, said oscillating means will begin oscillating at said preselected frequency to thereby provide an indication of said alignment from said oscillating means.

2. The precision presence detector of claim 1 wherein said oscillating means comprises said first and second inductive sensing elements, as well as a broadband amplifier means having input and output terminals, said output terminals including a pair of output indication terminals, said first inductive sensing element electrically coupled to one of said input terminals of said amplifier means, another of said inputs of said amplifier means being grounded, said second inductive sensing element electrically coupled to one of said output terminals of said amplifier means, and both said first and second inductive sensing elements electrically connected to ground.

3. The precision presence detector of claim 1 wherein said inert tuning means comprises said first and second inductive tuned elements and a variable capacitive device, said first and second inductive tuned elements electrically coupled to one another and both said first and second inductive tuned elements electrically coupled to opposite ends of said variable capacitive device.

4. The precision presence detector of claim 1 wherein said first and said second sensing elements, as well as said first and said second tuned elements, are oriented 90 relative to one another.

5. The precision presence detector of claim 1 wherein said inductive elements comprise conductive coils wound about ferrite cores.

6. An object precision presence detector comprising in combination:

a. an oscillating means having first and second inductive sensing elements, b. an inert tuning means having first and second inductive tuned elements, said first and second inductive sensing elements of said oscillating means spaced in a predetermined relationship with each other so that essentially zero magnetic coupling exists between said first and said second inductive sensing elements in the presence of said object and therefore said oscillating means normally assumes a nonoscillating condition, said first and second inductive tuned elements of said inert tuning means spaced the same said predetermined relationship with each other as said first and second inductive sensing elements, said inert tuning means resonating at a preselected one of many possible frequencies so that whenever said first and second inductive tuned elements are in direct alignment with and proximate to said first and second inductive sensing elements, respectively, said oscillating means will assume an oscillating condition at said preselected frequency to thereby provide an indication that said oscillating means is precisely aligned with said inert tuning means.

7. The precision presence detector of claim 6 wherein said first and said second sensing elements, as well as said first and said second tuned elements, are oriented 90° relative to one another.

8. The precision presence detector of claim 6 wherein said oscillating means moves with said object along a predetermined path and said inert timing means is stationary.

9. The precision presence detector of claim 6 wherein said object is a moving railway vehicle.

10. A precision presence detector comprising in combination:

a. an oscillating means having first and second inductive sensing elements, b. a resonant circuit means having first and second inductive tuned elements, said first and second inductive sensing elements spaced in a predetermine relationship with each other so that essentially a zero magnetic coupling exists between said first and said second inductive sensing element, and said oscillating means initially in a nonoscillating condition, said resonant circuit means mounted on an object moving relative to said oscillating means and resonating at one preselected frequency, said first and second inductive tuned elements of said resonant circuit means spaced in a predetermined relationship with each other, said first and second inductive sensing elements of said oscillating means spaced the same said predetermined relationship with each other as said first and second inductive tuned elements so that whenever said first and second tuned elements are in direct alignment with and proximate to said first and second inductive sensing elements, respectively, said oscillating means will oscillate at said preselected frequency to thereby provide a signal of the presence and identification of said object.

11. The precision presence detector of claim 10 wherein said first and said second sensing elements, as well as said first and said second tuned elements, are disposed in a 90° relationship with one another.

12. The precision presence detector of claim 10 wherein said resonant circuit means moves with said object along a predetermined path and said oscillating means is stationary.

13. The precision presence detector of claim 10 wherein said object is a moving railway vehicle.

14. A detector circuit comprising in combination a. an oscillating means having first and second inductive sensing elements, b. a resonant circuit means having first and second inductive tuned elements, said first and second inductive sensing elements and said first and second inductive tuned elements each comprising a conductive coil wound about a ferrite core, said oscillating means mounted on a railway vehicle moving along a trackway while said resonant circuit means is in a stationary position along said trackway, said first and second inductive sensing elements of said oscillating means spaced in a predetermined relationship with each other so that essentially zero magnetic coupling exists between said first and second inductive sensing elements and, therefore, sad oscillating means normally assumes a nonoscillating condition, said first and second inductive tuned elements of said resonant circuit means spaced the same predetermined relationship with each other as said first and second inductive sensing elements, said resonant circuit means resonating at a preselected frequency so that whenever said first and second inductive tuned elements are in direct parallel alignment with and proximate to said first and second inductive sensing elements, respectively, said oscillating means will oscillate at said preselected frequency thereby providing an indication on said railway vehicle of the passage of said resonant circuit means.

15. A precision presence detector comprising in combination:

a. an oscillating means having first and second inductive sensing elements, b. a resonant circuit means having first and second inductive tuned elements, said first and second inductive sensing elements spaced in a predetermined relationship with each other so that essentially a zero magnetic coupling exists between said first and said second inductive sensing element, and said oscillating means initially in a nonoscillating condition, said first and second inductive sensing elements and said first and second inductive tuned elements each comprising a coil wound about a ferrite core, said resonant circuit means mounted on a railway vehicle moving along a predetermined path and resonating at a preselected frequency while said oscillating means is disposed at a preselected point along said predetermined path, said first and second tuned elements tunedelements of said resonant circuit means spaced in a predetermined relationship with each other so that said resonant circuit means normally resonates at a predetermined frequency, said first and second inductive sensing elements of said oscillating means spaced the same predetermined relationship with each other as said first and second inductive tuned elements so that whenever said first and second inductive tuned elements are in direct alignment with and proximate to said first and second inductive sensing elements, respectively, said oscillating means will oscillate at said predetermined frequency thereby providing a signal that said railway vehicle has passed the preselected point along said predetermined path.

PO-1050
(5/69)

UNITED STATES PATENT OFFICE
CERTIFICATE OF CORRECTION

Patent No. 3,609,349 Dated September 28, 1971

Inventor(s) Emil F. Brinker

It is certified that error appears in the above-identified patent and that said Letters Patent are hereby corrected as shown below:

Column 8, line 18, change sad to "said"

Column 8, line 52, after second insert "inductive"

Column 8, line 52, erase "tuned elements"

Signed and sealed this 28th day of March 1972.

(SEAL)
Attest:

EDWARD M.FLETCHER,JR.
Attesting Officer

ROBERT GOTTSCHALK
Commissioner of Patents